United States Patent [19]
Takahashi et al.

[11] Patent Number: 5,281,152
[45] Date of Patent: Jan. 25, 1994

[54] SURFACE-MOUNTED ELECTRONIC COMPONENT

[76] Inventors: Hisafumi Takahashi; Naoki Sugita, both of c/o Kel Corporation, 6-17-7, Nagayama, Tama-city, Tokyo, 206, Japan

[21] Appl. No.: 914,870

[22] Filed: Jul. 15, 1992

[30] Foreign Application Priority Data

Jul. 19, 1991 [JP] Japan ............... 3-64113[U]

[51] Int. Cl.⁵ .............................. H01R 9/09
[52] U.S. Cl. ........................ 439/79; 439/83; 439/874
[58] Field of Search ............ 439/79, 80, 83, 874, 439/876, 78, 875

[56] References Cited

U.S. PATENT DOCUMENTS

| | | | |
|---|---|---|---|
| 4,583,807 | 4/1986 | Kaufman et al. | 439/83 |
| 4,621,880 | 11/1986 | Rush | 439/83 |
| 4,826,442 | 5/1989 | Douty et al. | 439/83 |
| 4,992,052 | 2/1991 | Verhoeven | 439/79 |
| 5,046,952 | 9/1991 | Cohen et al. | 439/79 |
| 5,090,912 | 2/1992 | Zell | 439/79 |

Primary Examiner—Larry I. Schwartz
Assistant Examiner—Hien D. Vu

[57] ABSTRACT

A surface-mounted electronic connector in which board connecting end portions of contacts of the connector extend in mutually parallel, closely spaced apart, coplanar relation and are maintained spaced apart above the board by feet of equal height which depend from tips of respective end portions. The height of each foot is not less than the sum the above-board height of a connection portion of a conductive layer of the board and the height of a reflow solder layer or pad thereon.

6 Claims, 4 Drawing Sheets

SURFACE-MOUNTED ELECTRONIC COMPONENT

FIELD OF THE INVENTION

The invention concerns electronic components such as connectors, having leads connected to a printed circuit board by a surface-mount technique.

BACKGROUND OF THE INVENTION

Surface-mounted electronic components such as connectors having leads extending from main insulating bodies for direct connection by reflow soldering to the conductive layers or paths on a printed circuit board, are well known.

As shown in FIG. 7, a known surface-mounted connector 50 comprises a main body 51 and a series of lead portions 52 which extend away from a rear side of the main body 51 and have remote ends adapted for surface-mount connection with respective conductive layers 54 of a printed circuit board 53.

In recent years, the inexorable trend to miniaturization with increasing complexity leads to an increasing requirement for ever higher densities of packing electronic parts on printed circuit boards with significantly reduced pitches of leads 52 and conductive layers 54.

However, as the pitch of the conductive layers 54 is reduced, any variation in the pitch leads 52, for example, deformation by bending inadvertently, or imprecise installation of the connectors on the printed circuit board 53 provides a significantly increased risk of the leads 52 contacting adjacent layers 54. This imposes a practical limit on the closeness of the pitch, making it difficult to install electronic parts at high densities.

Furthermore, there is an increasing tendency for the printed circuit boards 53 to be thinner, also increasing risk of deformation by warping with a consequential increase in variation of the pitches of the leads and in the risk of the leads 52 unintentionally contacting an adjacent conductive layer 54.

Additionally, if board warping occurs, there is an increased risk of poor contact pressure between the ends of the leads 52 and the conductive layers 54, during the surface mounting.

Surface-mount connection is conventionally performed by installing connector 50 on the printed circuit board 53 with respective leads contacting reflow solder pads overlayed on the conductive layers 54 and heating the assembly in a furnace or oven thereby melting the solder layers so that the respective leads located thereon are connected to the conductive layers by the molten solder.

In the event of board deformation, such as warping, when the connector is located on the printed circuit board for soldering, some of the leads 52 may become separated from the conductive layer 54, (float on top of the layer), with the result that, even if the reflow solder layer on the conductive layers of the board is melted, the molten solder may not contact such leads 52 with consequential faulty connection. Furthermore, since the circuit board itself is also subject to the heat from the furnace or oven, the possibility of heat deformation of the circuit board increases still further increasing the risk of poor connection.

SUMMARY OF THE INVENTION

An object of the invention is to provide a surface-mounted electronic component adapted for mounting at high density with only a small risk of the leads thereof making faulty contact with the conductive layers of the board enabling reliable permanent surface-mount connection between such leads and the conductive layers of the printed circuit board.

According to one aspect of the invention, there is provided an electronic component for connecting by surface mount technique to a circuit board having first and second rows of conductive paths carrying reflow solder pads and arranged with the pads of one row in staggered relation, longitudinally of the rows, to the pads of the other row, the component having a body with a circuit board engaging face, a series of board connecting lead portions extending in parallel relation in a predetermined close pitch from a side of a body adjacent the circuit board engaging face and having end portions terminated by tips remote from the body, and anchoring feet depending from the respective tips towards the board engaging face aligned for connection with respective solder pads, the feet being of equal height so as all to upstand from the circuit board by the same predetermined distance, whereby the end portions are maintained in coplanar relation spaced above the circuit board.

Preferably, the distance is greater than the sum of the thicknesses of the conductive paths above the circuit boar and the thicknesses of the reflow solder pads thereon.

This both minimizes the risk of inadvertent cross-connection both before and after soldering and enables soldering heat to be applied directly to the contact end portions using a pulse heater, avoiding application of heat to the board and consequential risk of heat deforming.

BRIEF DESCRIPTION OF THE DRAWINGS

Specific embodiments of the invention will now be described by example only, with reference to accompanying drawings in which.

Figure 1:
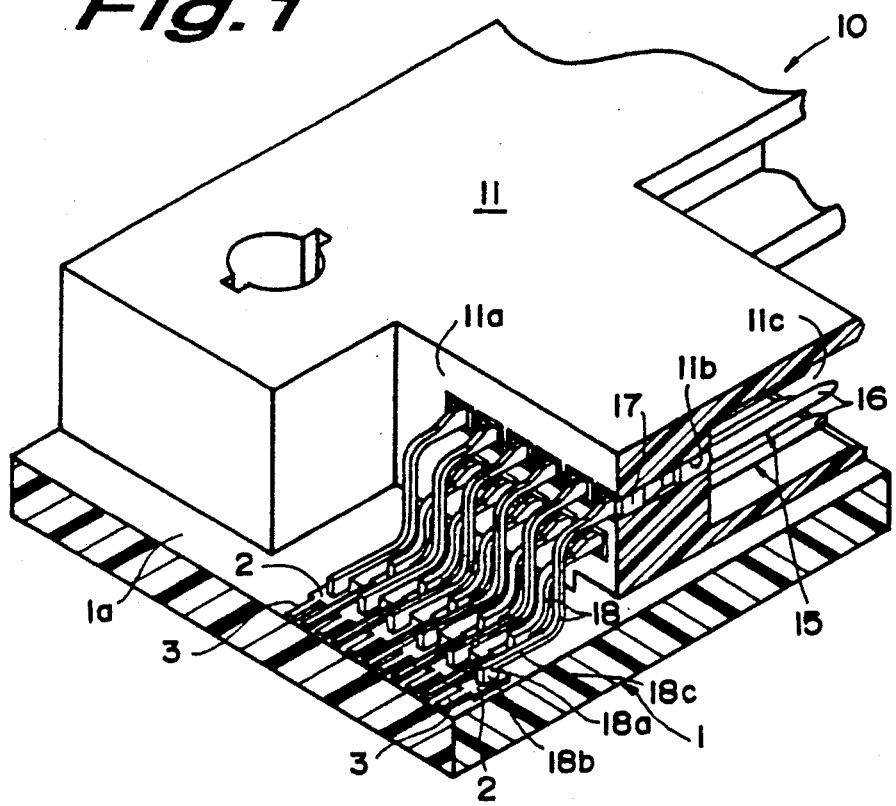
FIG. 1 is a perspective view, partly in cross-section of a surface-mounted connector according to the invention.

The connector 10 comprises a plurality of contacts 15 mounted in an insulating housing 11. Each contact 15 has a central, anchoring portion 17 which is press-fitted in an aperture 11b in the housing 11; a contact pin 16 extending forwardly from the anchoring portion 17 into a mating cavity 11c and, a lead portion 18 extending rearwardly, from a rear side 11a of the housing.

The housing 11 is installed on the printed circuit board 1 with a bottom surface of the housing engaging the printed circuit board 1 so that the rear surface 11a upstands perpendicularly to the surface 1a of the printed circuit board 1. The contacts 15 are assembled with the housing 11, by forcible insertion, pins 16 leading, into the rear side 11a. The lead portions 18 are then bent, firstly downwardly and then rearwardly to extend adjacent the surface 1a of the printed circuit board 1 providing end portions 18c which extend rearwardly parallel to and spaced apart above the surface 1a in substantially coplanar relation. Tips 18a of the end portions 18c are formed with depending feet 18b of equal height which are soldered to the respective conductive layers to provide the surface-mounted connection.

The conductive layers formed on the surface of the printed circuit board 1 comprise connecting portions 2 of large or increased widths for connection with depending feet 18b and narrow or reduced width conductive tracks 3 which extend away from the respective connecting portions 2. In order to obtain high density of connection or close pitch in spite of the large width of the connecting portions, the connecting portions are located in two, parallel rows, in zig-zag or staggered relation.

Lead portions 18 are also correspondingly staggered and have alternating long and short end portions 18c so that respective feet 18b are located on the corresponding connecting portions 2.

Figure 3A:
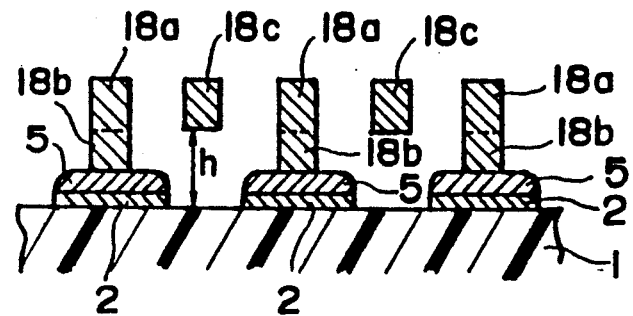
FIGS. 3(a) and (b) are cross-sectional views of lead portions of the connector of FIG. 1 prior to soldering and after soldering respectively, taken along the lines 3—3 of FIG. 2.

Prior to connection, cream solder is applied to the connecting layers 2 to form solder pads 5, as shown in FIG. 3(a). When the connector 10 is positioned on the printed circuit board 1, the end portions 18a of the leads 18 are aligned above the corresponding connecting 2 and the feet 18b, and stand on the solder pads 5.

Figure 2:
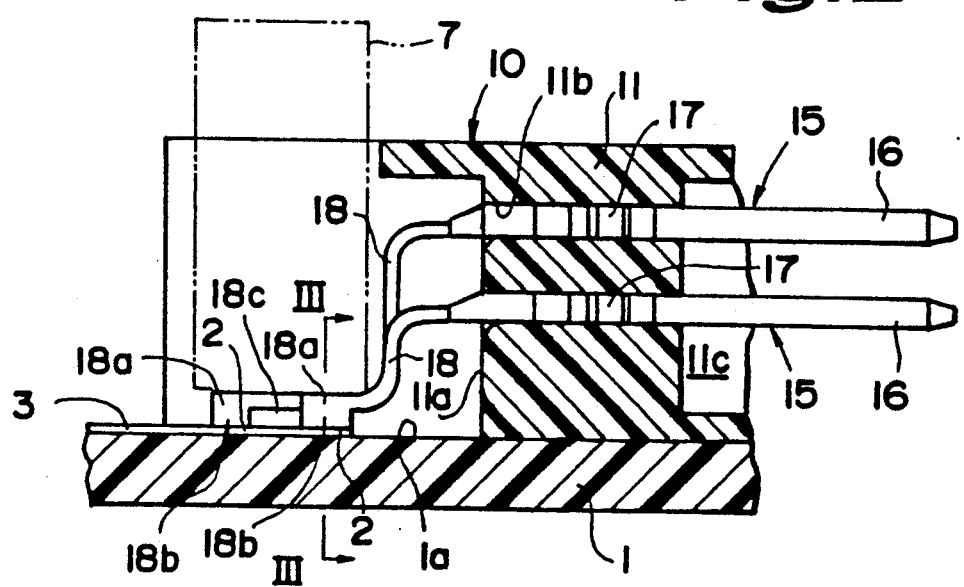
FIG. 2 is a cross-sectional view of the connector of FIG. 1.

A pulse or ultrasonic heater, represented by broken lines in FIG. 2, is then placed in contact with upper surfaces of all tips 18a, also connecting with all the horizontally extending lead portions 18c, thereby heating the feet 18b, melting the cream solder so that, as shown in FIG. 3 (b), the depending feet 18b engage or contact the connecting layers 2 either directly, or via portions of the respective solder pads 5, effecting connection between such leads and the conductive layers of the printed circuit board.

Thus, only the tips 18a and end portion 18c of the lead 18 are heated and the printed circuit board 1 is affected only minimally or not at all by the heat obviating risk of heat deformation.

As the end portions 18a are pressed against the board by the ultrasonic heater all the depending feet are brought into reliable contact with the connecting layers 2, even if spaced above the layers as result of board warping, etc., obviating risks of poor connection.

Furthermore, uppermost surfaces of all end portions 18a and portions 18c extending from those ends are coplanar ensuring that the planar face of the ultrasonic heater 7 contacts them all and provides effective heating, without exception.

As the connecting layers are wider than the leads 18, the solder fillets formed between the sides of the feet 18b and the connecting portions 2 can be of increased size thereby increasing the strength of the soldered connection.

Figure 3B:
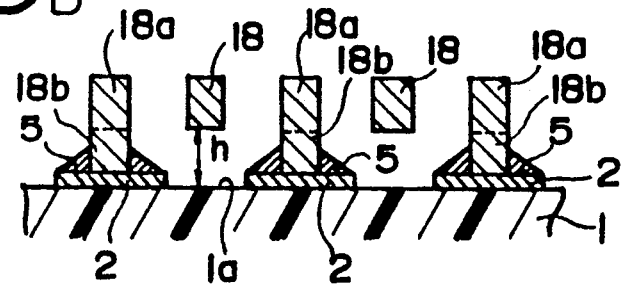
Figure 4:
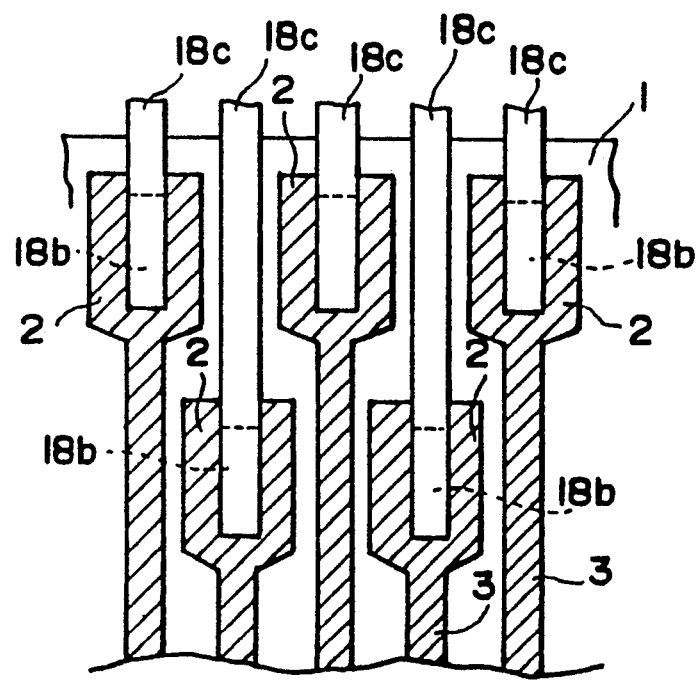
FIG. 4 is fragmentary plan view of lead portions connected by reflow soldering to the circuit board.

As indicated previously, when the widths of the connecting layers is increased the possibility of unintended, incorrect contact between horizontally extending end portions 18c and adjacent connecting layers and solder fillets is also increased. However, in accordance with the invention, during the soldering process, the horizontally extending lead end portions 18c are maintained separated by a specific distance h from the surface 1a of the printed circuit board 1, by the depending feet 18b, as shown in FIGS. 3(a) and 3(b), obviating any risk of any longer lead portions contacting any connecting portions 2 to which shorter lead portion are connected, again enabling closer pitch and higher packing fraction on the circuit board.

The distance h or the height of the feet should always be sufficient to prevent the lead portions 18c from touching the solder pads or fillets 5 both before and after the solder is melted, requiring that h be greater than the combined thicknesses of a connecting portion 2 above the board and a solder pad 5 (or the anticipated height of a fillet).

Figure 5:
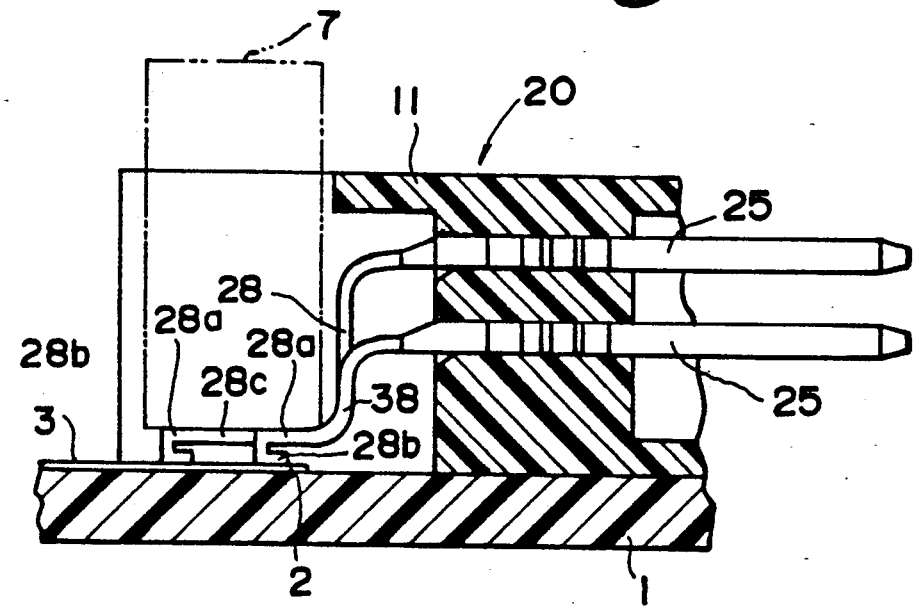
FIG. 5 is a fragmentary cross-sectional of a second embodiment of the invention.
Figure 6:
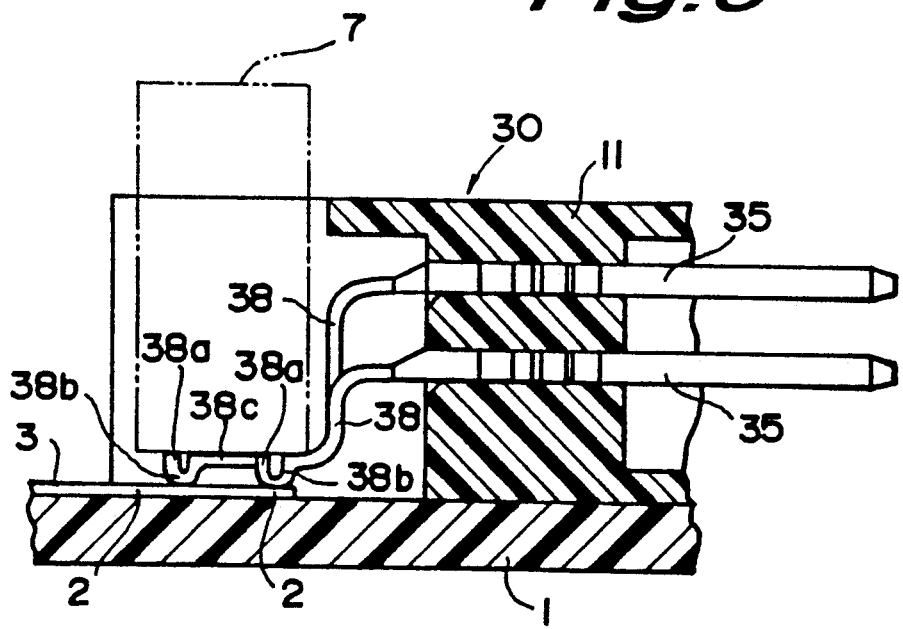
FIG. 6 is fragmentary cross-sectional of a third embodiment of the invention.
Figure 7:
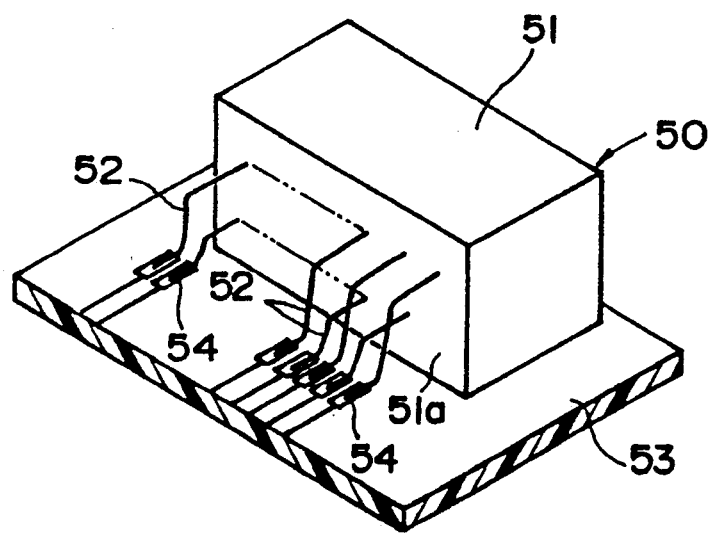
FIG. 7 is a perspective view of a conventional surface-mounted connector.

In the second and third alternative embodiments, the feet may be formed as shown in FIGS. 5 and 6.

In the connector 20 of FIG. 5, the feet 28b of contacts 25 are formed by reversely bending the end portions 28a of the leads into a depending C-shape. Here again, the feet 28b ensure that the horizontally extending lead end portions 28c are spaced a predetermined distance above the surface of the printed circuit board 1.

In the connector 30 of FIG. 6, feet 38b of contact 35 are formed by bending respective end portions 38a of leads 38 into depending U-shapes. Both before and after the soldering step, the feet 38b space the horizontally extending lead end portions 38c a predetermined distance above the surface of the printed circuit board 1.

Although the above described embodiments are electrical connectors, the invention embraces all electronic components or parts which have numerous leads projecting from sides of insulating main bodies.

In summary, the provision of the feet of predetermined height obviates or minimizes risk of incorrect cross-connection both before and after reflow soldering, enabling closer lead pitch and higher component densities on the circuit board, while the coplanar relation of the upper surfaces of the lead end portions enables use of an ultrasonic heater to connect all the lead portions simultaneously, obviating risk of board warpage arising from heat applied to the board, while the pressing action of the heater ensures that all feet contact the solder layers for effective soldering, even if the board is slightly warped.

What is claimed is:

1. An electronic component for connecting by surface mount technique to a circuit board having first and second, spaced apart, parallel rows of reflow solder pads carried by respective conductive paths, the pads of one row being in staggered relation to the pads of the other row, the component having a body with a circuit board engaging face, a series of lead portions extending in parallel relation in a predetermined close pitch from a side of a body adjacent the circuit board engaging face and adjacent the first row and on a side thereof remote from the second row and having, respectively, long and short end portions terminated by tips remote from the body, and anchoring feet depending from the respective tips towards the board engaging face, the long end portions having lengths at least equal to a distance by which the rows are spaced apart so that the long end portions can span the rows and extend from the body across the first row with respective anchoring feet thereof aligned for connection to the solder pads of the second row and with anchoring feed of the short end portions aligned for connection with respective solder pads of the firs row, the feed being of equal height so as all to upstand form the circuit board by a same predetermine distance, whereby the long and the short end portions are maintained in coplanar relation spaced above the circuit board and substantially parallel thereto so that a planar face of a heater can be brought into operative engagement with the tips of all of both sort and long end portions to press them, simultaneously, against respective solder pads of the circuit board for connection thereto by reflow soldering.

2. An electronic component according to claim 1 in which the distance is greater than a sum of the thicknesses of the conductive paths above the circuit board and the thicknesses of the reflow solder pads thereon.

3. An electronic component according to claim 2 in which the feet are made by forming the end portions into a C-shape.

4. An electronic component according to claim 2 in which the feet are made by forming the end portions into a U-shape.

5. An electronic component according to claim 2 in which the feet comprise plate-like portions extending with respective major planes perpendicular to the circuit board.

6. An electronic component according to claim 5 in which the lead portions having long and short end portions extend from the side of the body in upper and in lower rows, respectively, vertically spaced apart above the board engaging face and have portions extending downwardly from the side of the body and joining respective coplanar end portions.

* * * * *

UNITED STATES PATENT AND TRADEMARK OFFICE
CERTIFICATE OF CORRECTION

PATENT NO. : 5,281,152
DATED : JAN 25, 1994
INVENTOR(S) : TAKAHASHI ET AL

It is certified that error appears in the above-indentified patent and that said Letters Patent is hereby corrected as shown below:

Claim 1, Col 4, Line 64 "feed" should read --feet--
Claim 1, Col 4, Line 66 "firs" should read --first
 and "feed" should read --feet--
Claim 1, Col 4, Line 67 "form" should read --from--
Claim 1 Col 5, Line 5, "sort" should read --short--

Signed and Sealed this

Twelfth Day of July, 1994

Attest:

BRUCE LEHMAN

*Attesting Officer*     *Commissioner of Patents and Trademarks*